(12) United States Patent
Yang

(10) Patent No.: US 7,355,344 B2
(45) Date of Patent: Apr. 8, 2008

(54) FLAT PANEL DISPLAY AND METHOD OF MANUFACTURING THE SAME

(75) Inventor: Nam-Choul Yang, Suwon-si (KR)

(73) Assignee: Samsung SDI Co., Ltd., Suwon (KR)

( * ) Notice: Subject to any disclaimer, the term of this patent is extended or adjusted under 35 U.S.C. 154(b) by 43 days.

(21) Appl. No.: 11/282,608

(22) Filed: Nov. 21, 2005

(65) Prior Publication Data

US 2006/0108921 A1 May 25, 2006

(30) Foreign Application Priority Data

Nov. 25, 2004 (KR) ..................... 10-2004-0097522

(51) Int. Cl.
*H01J 1/62* (2006.01)
*H01J 63/04* (2006.01)

(52) U.S. Cl. ...................... 313/512; 313/498
(58) Field of Classification Search ........ 313/500–512; 445/22–25; 438/21
See application file for complete search history.

(56) References Cited

U.S. PATENT DOCUMENTS 4,597,635 A * 7/1986 Hoshikawa ................. 349/73
2002/0067125 A1* 6/2002 Nogaki et al. ............... 313/510
2002/0125817 A1* 9/2002 Yamazaki et al. ........... 313/498
2003/0020124 A1 1/2003 Guenther
2003/0027369 A1* 2/2003 Yamazaki .................... 438/21
2004/0224598 A1* 11/2004 Tanaka ........................ 445/24
2004/0232833 A1* 11/2004 Menda et al. ................ 313/512
2005/0023960 A1* 2/2005 Harada et al. ............... 313/502
2006/0199461 A1* 9/2006 Yamazaki et al. ............ 445/24

FOREIGN PATENT DOCUMENTS

| EP | 0 821 545 A2 | | 1/1998 |
|---|---|---|---|
| JP | 58-005720 A1 | | 1/1983 |
| JP | 58005720 A | * | 1/1983 |
| JP | 2001-255514 A1 | | 9/2001 |
| JP | 2001255514 A | * | 9/2001 |

\* cited by examiner

*Primary Examiner*—Mariceli Santiago
*Assistant Examiner*—José M Diaz
(74) *Attorney, Agent, or Firm*—H.C. Park & Associates, PLC

(57) ABSTRACT

A flat panel display including a light emitting device having a sealed image display area, an encapsulating member, and an auxiliary encapsulating member. The encapsulating member is curved to have a space in which the light emitting device is sealed. The auxiliary encapsulating member is arranged on at least a bent portion of the encapsulating member.

42 Claims, 6 Drawing Sheets

FLAT PANEL DISPLAY AND METHOD OF MANUFACTURING THE SAME

CROSS-REFERENCE TO RELATED APPLICATIONS

This application claims priority to and the benefit of Korean Patent Application No. 10-2004-0097522, filed on Nov. 25, 2004, which is hereby incorporated by reference for all purposes as if fully set forth herein.

BACKGROUND OF THE INVENTION

1. Field of the Invention

The present invention relates to a flat panel display and a method of manufacturing a flat panel display, and more particularly, to sealed, flexible flat panel display and a method of manufacturing the sealed, flexible flat panel display.

2. Discussion of the Background

Generally, flat panel displays (FPDs), such as organic light emitting displays (OLEDs), thin film transistor liquid crystal displays (TFT-LCD), etc., have characteristics allowing them to be made thin and flexible. Accordingly, much research is being conducted into thin, flexible FPDs.

A flexible substrate is used to produce thin, flexible FPDs, and a plastic substrate is often used as the flexible substrate.

However, because FPDs undergo complicated fabrication processes, such as forming an organic film, a thin film transistor layer, an electrode layer, an orientation layer, etc., on a substrate, depending on the FPD's particular characteristics, when using a plastic substrate, such processes may deform the plastic substrate or the thin layers formed on the plastic substrate. Also, plastic is generally less dense than glass.

Furthermore, a plastic substrate may not effectively prevent permeation of water or air.

To solve this problem, a plastic substrate may be coated with a barrier layer to block permeation of water or air.

For example, U.S. Pat. Nos. 6,268,695 and 6,497,598 disclose an organic light emitting device encapsulated in a film including polymer layers and a ceramic layer interposed between the polymer layers. U.S. Pat. No. 6,413,645 discloses an organic light emitting device encapsulated in a stack of at least one polymer layer and at least one inorganic layer. U.S. Pat. No. 6,522,067 discloses an organic light emitting device encapsulated in a stack of at least one barrier and at least one polymer layer. U.S. Pat. No. 6,548,912 discloses a micro-electronic device encapsulated in a stack of at least one barrier layer and at least one polymer layer. U.S. Pat. No. 6,570,325 discloses an organic light emitting device encapsulated in a stack where a barrier layer is interposed between decoupling layers. U.S. Pat. No. 6,573,652 discloses a display device encapsulated in a stack of at least one barrier layer and at least one polymer layer.

However, when using such a barrier layer, which includes an inorganic film, to encapsulate an FPD, the barrier layer may be too thin, which may degrade its durability. Even when the barrier layer is formed on a flexible plastic substrate, the limit of a process temperature is low, so manufacturing an FPD may be difficult.

Thus, there is room for improvement in sealing display devices for flexible FPDs.

Korean Patent Publication No. 2003-2946 discloses an organic light emitting device sealed by plastic that is heated and press-fitted onto the light emitting device instead of being adhered by an adhesive. In this case, although sealing may be simply performed, the plastic may not completely prevent permeation of water and air. This results in degradation of the lifespan and durability of the organic light emitting device.

U.S. Patent Publication No. 2003/0027369 A1 discloses a method of making a light emitting device that is vacuum-sealed with a bag-like plastic film inside of which inorganic insulating films, which may prevent oxygen or water from penetrating therein, and an organic insulating film, which has a smaller internal stress than the inorganic insulating films, are laminated. However, when the plastic film having the inorganic insulative film bends, the inorganic insulative film may crack, leading to degradation of the ability of preventing permeation of water and air.

Japanese Patent Publication No. 1993-144569 discloses a method of manufacturing a light emitting device that is sealed by forming a thermoplastic hygroscopic film on both sides of the light emitting device, heating and press-fitting the film onto the light emitting device to seal the device's peripheral parts, and then covering the sealed light emitting device with an outer cover film. However, the thermoplastic hygroscopic film and the outer cover film may not completely prevent permeation of water and air.

SUMMARY OF THE INVENTION

The present invention provides a flexible flat panel display that may be simply manufactured and that may block water and oxygen, and a method of manufacturing the flat panel display.

Additional features of the invention will be set forth in the description which follows, and in part will be apparent from the description, or may be learned by practice of the invention.

The present invention discloses a flat panel display including a light emitting device having a sealed image display area, an encapsulating member being curved to have a space where the light emitting device is sealed, and an auxiliary encapsulating member arranged on at least a bent portion of the encapsulating member.

The present invention also discloses a method of manufacturing a flat panel display including forming a light emitting device by forming an image display area on a substrate and sealing the image display area, setting the light emitting device on an encapsulating member, arranging an auxiliary encapsulating member on the encapsulating member, bending the encapsulating member so that the light emitting device is within a space made by the bent encapsulating member, and sealing edges of the encapsulating member. The auxiliary encapsulating member is located at a bent portion of the encapsulating member It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE ILLUSTRATED EMBODIMENTS

Figure 1:
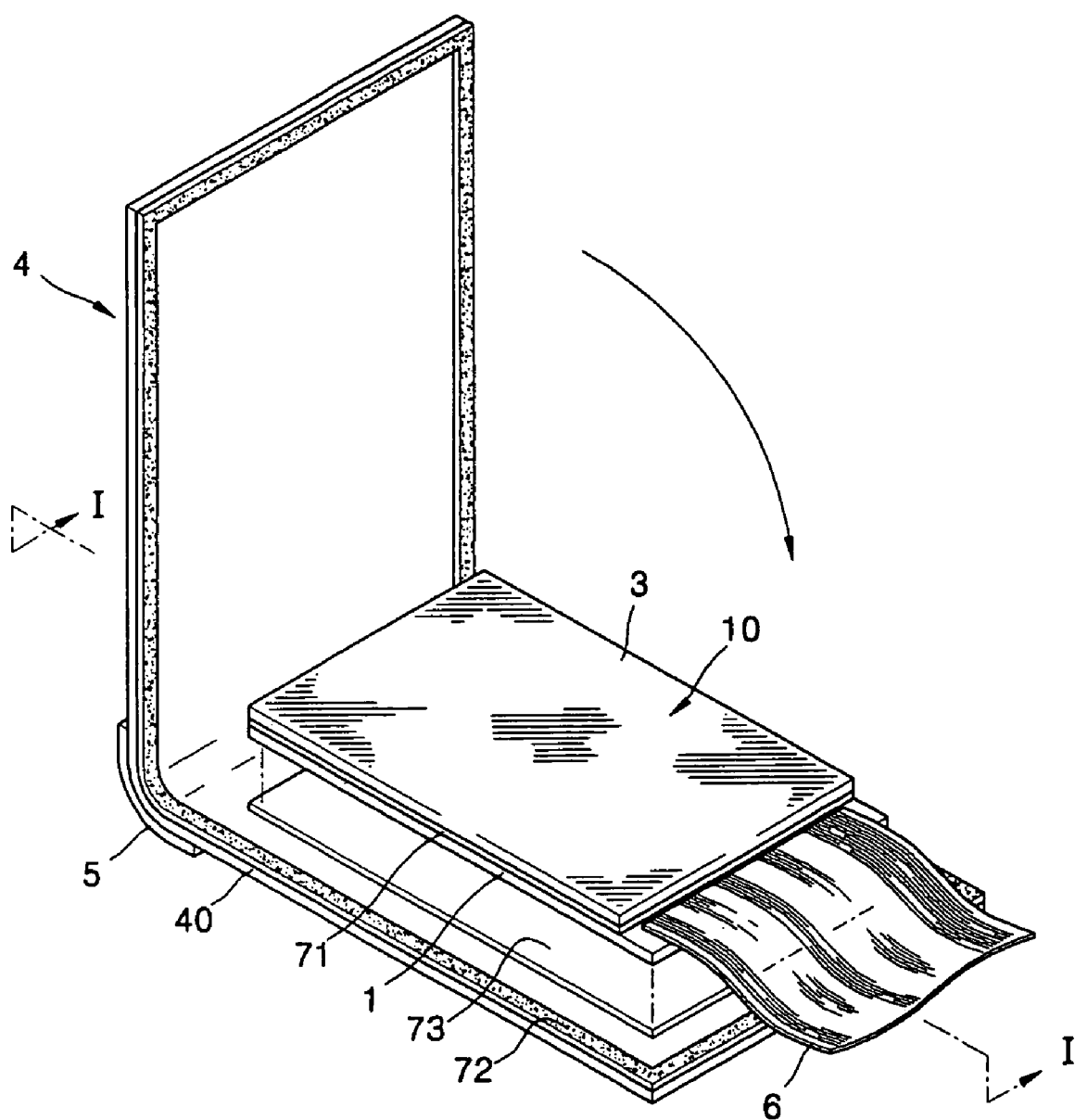
FIG. 1 is an exploded perspective view of a flat panel display according to an embodiment of the present invention.
Figure 2:
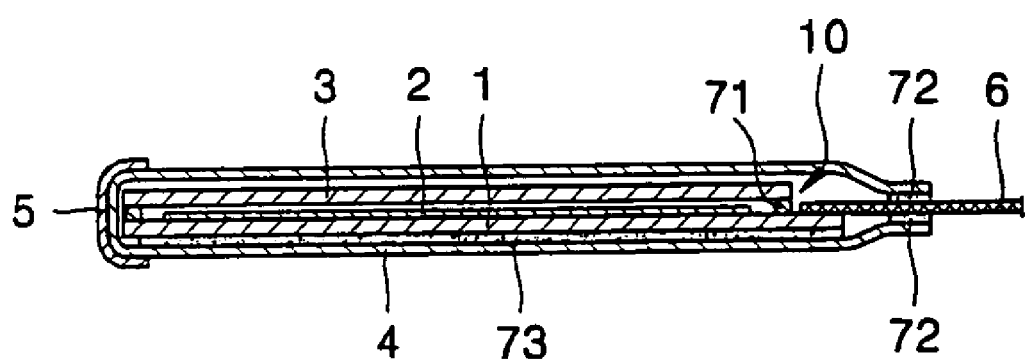
FIG. 2 is a cross-section taken along line I-I of FIG. 1.

FIG. 1 is an exploded perspective view of a flat panel display according to an embodiment of the present invention. FIG. 2 is a cross-section taken along line I-I of FIG. 1. While the flat panel display of FIG. 1 and FIG. 2 is shown as an organic light emitting display, it may be one of various types of flat panel displays including a liquid crystal display, an inorganic light emitting display, and an electron emission display.

Referring to FIG. 1 and FIG. 2, the flat panel display may include an encapsulating member 4, a light-emitting device 10 arranged inside the encapsulating member 4, and an auxiliary encapsulating member 5 arranged on at least a curved portion of the encapsulating member 4. The light emitting device 10 includes a substrate 1, an image display portion 2 formed on the substrate 1 and including an organic light-emitting device, and a sealing element 3 coupled with the substrate 1 to protect the image display portion 2 from the external atmosphere.

The image display portion 2, which includes the organic light emitting device, displays an image.

Various types of organic light emitting devices may be used as the organic light emitting device of the image display portion 2. In other words, a simple passive-matrix (PM) organic light emitting device or an active-matrix (AM) organic light emitting device, which has a thin film transistor (TFT) layer, may be used as the organic light emitting device included in the image display portion 2.

Figure 3:
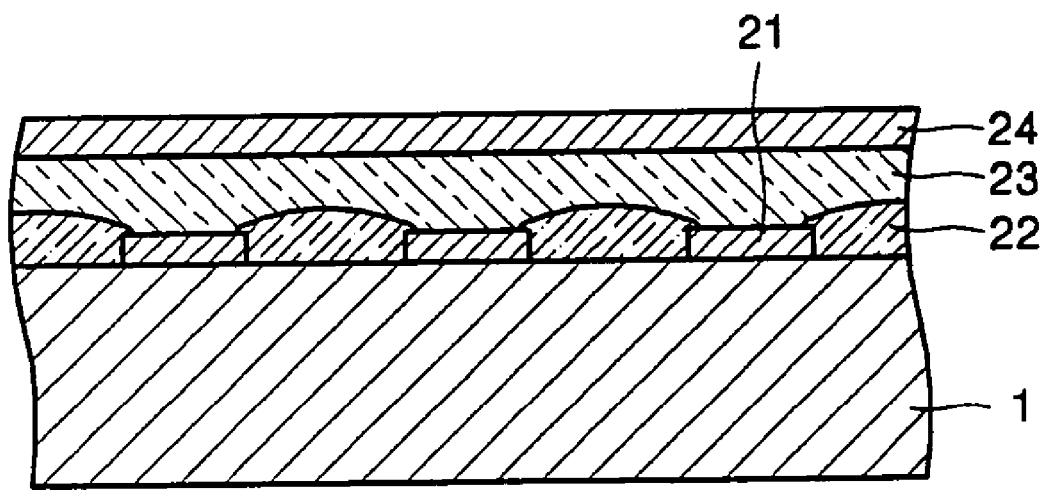
FIG. 3 is a cross-section of an example of an image display portion shown in FIG. 1.

FIG. 3 shows an example of a PM organic light emitting device. Referring to FIG. 3, a first electrode layer 21 is formed on a substrate 1 in strips, and an organic layer 23 and a second electrode layer 24 are sequentially formed on the first electrode layer 21. An insulative layer 22 may be interposed between adjacent first electrode strips 21, and the second electrode layer 24 may be formed in strips that cross the first electrode strips 21 at right angles. The organic layer 23 may be a small molecular weight organic layer or a polymer organic layer. When using a small molecular weight organic layer, a hole injection layer (HIL), a hole transport layer (HTL), an emissive layer (EML), an electron transport layer (ETL), an electron injection layer (EIL), etc. may be stacked in a single or complex structure. The organic material may be various materials including copper phthalocyanine (CuPc), N,N-Di(naphthalene-1-yl)-N,N'-diphenyl-benzidine; NPB, and tris-8-hydroxyquinoline aluminum (Alq3). The small molecular weight organic layer may be formed by vacuum deposition.

A polymer organic layer usually includes an HTL and an EML. The HTL may be PEDOT, and the EML may be formed of a polymer organic material, such as poly-phenylenevinylene (PPV) or polyfluorene, by screen printing, inkjet printing, or other like methods. The first electrode layer 21 may serve as an anode electrode, and the second electrode layer 24 may serve as a cathode electrode. Alternatively, the first electrode layer 21 may serve as the cathode, and the second electrode layer 24 may serve as the anode.

In front-emission light emitting displays, the second electrode layer 24 may be a transparent indium-tin-oxide (ITO) electrode. In rear-emission light emitting displays, the first electrode layer 21 may be a transparent electrode. The second electrode layer 24 may be produced by forming a thin semi-permeable metal film, such as, Mg, Ag, or other like materials, and depositing transparent ITO on the thin semi-permeable film.

Figure 4:
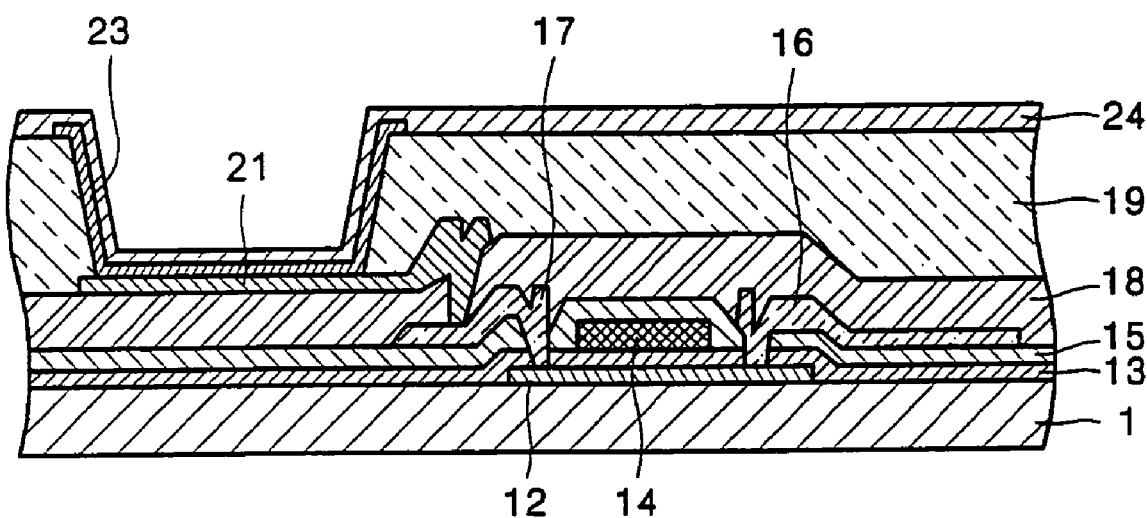
FIG. 4 is a cross-section of another example of the image display portion shown in FIG. 1.

FIG. 4 shows an example of an AM organic light emitting device. Referring to FIG. 4, each pixel of the image display portion 2 shown in FIG. 1 and FIG. 2 has a TFT and a self-luminant light emitting diode.

The TFT included in each pixel need not have the exemplary structure shown in FIG. 4. Additionally, the number of TFTs included in each pixel and the structure of each TFT may vary. The AM organic light emitting device is described in greater detail below.

As shown in FIG. 4, a TFT is formed on the substrate 1. The TFT includes an active layer 12 formed on the substrate 1, a gate insulating film 13 formed on the active layer 12, and a gate electrode 14 formed on the gate insulating film 13.

An inter-insulator 15 is formed on the gate electrode 14 and the gate insulating film 13. A source electrode 16 and a drain electrode 17 are formed on the inter-insulator 15 and are coupled with a source area and a drain area, respectively, of the active layer 12 via contact holes.

A passivation film 18 of an insulative material is formed on the source and drain electrodes 16 and 17, and an insulative pixel defining film 19 is formed on the passivation film 18. The passivation film 18 may have a single-layered structure or a multi-layered structure.

Although not shown in FIG. 4, at least one capacitor is coupled with the TFT.

A first electrode layer 21, which serves as an anode electrode of an organic light emitting diode, is coupled with the drain electrode 17. As shown in FIG. 4, the first electrode layer 21 is formed on the passivation film 18, the pixel defining film 19 is formed on the first electrode layer 21, and an opening is formed in the pixel defining film 19 to expose a portion of the first electrode layer 21. Thereafter, an organic light emitting diode is formed. The organic light emitting diode may emit red, green or blue light according to an organic material and a flow of current to display image information. The organic light emitting diode includes the first electrode layer 21 coupled with the drain electrode 17 of the TFT and receiving positive power from the drain electrode 17, a second electrode layer 24 covering the entire area of each pixel and receiving negative power, and an organic layer 23 interposed between the first and second electrode layers 21 and 24 and emitting light.

The first electrode layer 21 may be a reflective electrode including a reflective layer of Ag, Mg, Al, Pt, Pd, Au, Ni, Nd, Ir, Cr, or a compound thereof, and ITO, IZO, ZnO, or $In_2O_3$ deposited on the reflective layer.

The second electrode layer 24 may be a transparent electrode formed by depositing a metal with a small work function, such as, Li, Ca, LiF/Ca, LiF/Al, Al, Mg, or a compound thereof, in a direction facing the organic layer 23 and forming an auxiliary electrode layer or a bus electrode line of a material suitable for forming a transparent electrode, such as ITO, IZO, ZnO, or $In_2O_3$, on the metal.

The second electrode layer 24 need not be deposited on the entire surface of each pixel. Rather, it may be formed to have various patterns. As described above, the first and second electrode layers 21 and 24 may be formed in strips that are orthogonal to each other.

The TFT structure and the organic light emitting diode structure are not limited to the above-described embodiment as they may be modified into various structures.

The substrate 1 on which the image display portion 2 is formed may be transparent or opaque. Glass or plastic may be used for the transparent substrate 1, and glass, plastic, or metal may be used for the opaque substrate 1. When the substrate 1 is transparent, the image display portion 2 may emit light toward the substrate 1 and/or the sealing element 3. When the substrate 1 is opaque, the image display portion 2 emits light toward the sealing element 3.

In an embodiment of the present invention, the substrate 1 may be flexible. In this case, the substrate 1 may include a plastic material. However, the substrate 1 may be made of various materials including thin glass or metal.

For example, plastic materials used to form the substrate 1 may include polyethylene terephthalate (PET), polyethylene naphthalate (PEN), polycarbonate (PC), polyether sulfone (PES), or other like materials.

When the substrate 1 is made of plastic, the image display portion 2 may be formed directly on the substrate 1, as shown in FIG. 3 and FIG. 4, so that a protection layer for protecting the image display portion 2 from water and air is not formed on the substrate 1. Since such a protection layer includes an inorganic layer, which may be difficult to form, it is preferable that a protection layer is not formed on the substrate 1 having the image display portion 2 formed directly thereon.

According to an embodiment of the present invention, the sealing element 3, which seals the image display portion 2, may be transparent or opaque. When the substrate 1 is transparent, the sealing element 3 may be formed of either a transparent material or an opaque material. On the other hand, when the substrate 1 is opaque, the sealing element 3 is formed of a transparent material.

Glass or plastic may be used to form a transparent sealing element 3, and glass, plastic, or metal may be used to form an opaque sealing element 3. In the embodiment of FIG. 1 and FIG. 2, the substrate 1 and the sealing element 3 are shown as having plate shapes.

When the sealing element 3 is a plastic plate, the plastic plate may not have any protection layers, as in the case where the substrate 1 is made of plastic. However, the present invention is not limited to this embodiment, and the sealing element 3 may be a plastic plate having a protection layer formed on at least one surface thereof. Such a protection layer will be described in greater detail below.

Edges of the sealing element 3 may be coupled with the substrate 1 using a first sealant 71. The first sealant 71 may be a thermosetting adhesive and/or an ultraviolet setting adhesive. Alternatively, the first sealant 71 may be frit glass.

Although not shown in the drawings, a moisture absorbing agent may be included in the space between the substrate 1 and the sealing element 3. The moisture absorbing agent, which absorbs oxygen and water, may be made of barium oxide, calcium oxide, or porous oxide. Examples of the porous oxide include porous silica, hydrated amorphous alumina, or a compound thereof. The hydrated amorphous alumina may be at least one of bohemite (AlOOH) and bayerite (Al(OH)$_3$). The moisture absorbing agent may be any other material that absorbs oxygen and water.

Pads (not shown) coupled with the image display portion 2 are exposed on one end of the substrate 1. A flexible printed circuit-board (FPC) 6 is bonded to the pads. The FPC 6 provides power to the image display portion 2 and is coupled with external electronic devices to provide various signals to the image display portion 2. After forming the light-emitting device 10, the light-emitting device 10 may be seated, e.g., placed, on the encapsulating member 4.

An adhering unit 73 may be formed on the encapsulating member 4, and the substrate 1 of the light-emitting device 10 is bonded with the adhering unit 73 to be seated on the encapsulating member 4. The adhering unit 73 may be a thermosetting adhesive and/or an ultraviolet setting adhesive. Alternatively, the adhering unit 73 may be double-sided tape. The adhering unit 73 may contain the above-described moisture absorbing agent. Additionally, the adhering unit 73 may be replaced by a moisture absorbing unit such as a moisture absorbing agent or a moisture absorbing tape.

After seating, e.g., setting or placing, the substrate 1 on the encapsulating member 4, the encapsulating member 4 may be bent as shown in FIG. 1 and FIG. 2 to seal the light-emitting device 10. Because the encapsulating member 4 has a second sealant 72 formed along its edges, two ends of the encapsulating member 4 may be bonded together. The second sealant 72 may be a thermosetting adhesive and/or an ultraviolet setting adhesive. Alternatively, the second sealant 72 may be frit glass.

Because the encapsulating member 4 is bent to seal the light-emitting device 10, it is preferred that the encapsulating member 4 is flexible.

When the encapsulating member 4 includes a single sheet to seal the light-emitting device 10, only three portions need to be bonded. Having fewer bonded portions may improve the sealing effect.

In an embodiment of the present invention, the encapsulating member 4 may be a protection film 40, which may include a single sheet.

Figure 5:
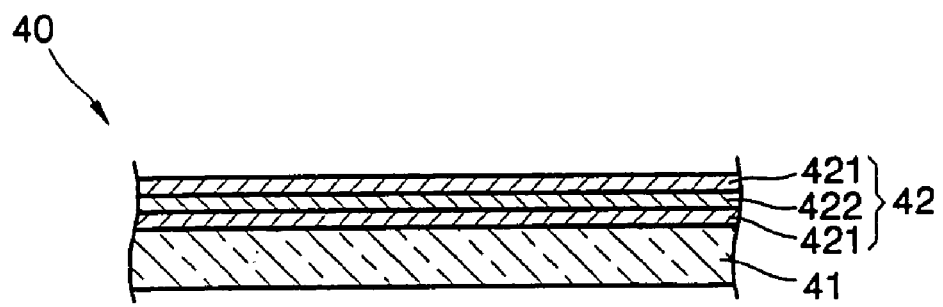
FIG. 5 is a magnified cross-section of a protection film shown in FIG. 1.

As FIG. 5 shows, the protection film 40 may be a base film 41 having a protection layer 42.

According to an embodiment of the present invention, the base film 41 may be made of plastic, and it is preferably transparent.

The protection layer 42 may be formed of a transparent material that blocks water and air. The protection layer 42 includes at least one inorganic layer 421, which may be formed of metal oxide, metal nitride, metal carbide, metal oxynitride, or a compound thereof. Examples of the metal oxide include silica, alumina, titania, indium oxide, tin oxide, indium tin oxide, and a combination thereof. Examples of the metal nitride include aluminum nitride, silicon nitride, and a combination thereof. The metal carbide may be a silicon carbide, and the metal oxynitride may be silicon oxynitride. Alternatively, the inorganic layer 421 may be formed of silicon, a ceramic derivative of silicon, or a ceramic derivative of metal. Furthermore, the inorganic layer 421 may be formed of any inorganic material that can block permeation of water and oxygen, for example, diamond-like carbon (DLC).

The inorganic layer 421 may be formed by vacuum deposition. In this case, pores included in the inorganic layer 421 may keep growing. Hence, a polymer layer 422 may be included to prevent the pores from continuously growing at the initial locations. The polymer layer 422 may be formed of an organic polymer, an inorganic polymer, an organometallic polymer, a hybrid organic/inorganic polymer, or other like materials. The polymer 422 is preferably formed of acryl resin.

The protection layer 42 may be formed on an inside surface of the base film 41 as shown in FIG. 5, and it may also be formed on an outside surface thereof.

The protection film 40 is preferably transparent. Hence, the protection layer 42 is also preferably formed of a transparent material.

The protection film 40 may be sealed by thermal pressing instead of using the second sealant 72. In other words, a part of the protection film 40 is thermally pressed so that the encapsulating member 4 may not include the protection layer 42 anymore. This thermal pressing preferably occurs on a part of the encapsulating member 4 to which the FPC 6 is bonded, because the part of the encapsulating member 4 can be bonded with the FPC 6.

When the protection film 40 includes the plastic base film 41 having the protection layer 42, the protection layer 42 can be formed using a separate process. Thus, the process of making an encapsulated organic light-emitting device may be simplified, and the process of forming the protection layer 42 may also be simplified.

When the protection film 40 having the protection layer 42 is bent as shown in FIG. 1 and FIG. 2, the portion of the inorganic layer 421 at the bent portion of the protection film 40 folds, which may damage the inorganic layer 421.

Hence, the auxiliary encapsulating member 5 may be installed at a location corresponding to the bent portion of the protection film 40 to maintain encapsulation of the device even when the inorganic layer 421 is damaged at the bent portion of the protection film 40.

The auxiliary encapsulating member 5 may be formed of flexible metal that has a high barrier characteristic. The auxiliary encapsulating member 5 may be formed by shaping the metal into a separate film and then attaching the metal film with the protection film 40 using an adhesive. Alternatively, the auxiliary encapsulating member 5 may be formed by depositing the metal on the bent portion of the protection film 40. The auxiliary encapsulating member 5 may be about 5 to 40 µm thick, preferably, about 10 to 20 µm thick.

Because the auxiliary encapsulating member 5 is formed on at least the bent portion of the encapsulating member 4 as described above, even when the inorganic layer 421 is damaged due to bending of the encapsulating member 4, the device may still be effectively sealed.

Figure 6:
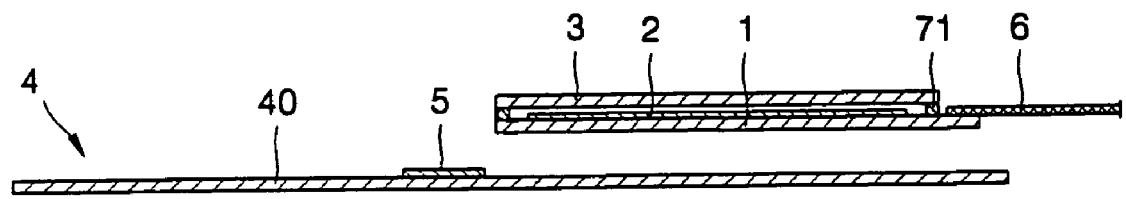
FIG. 6, FIG. 7, FIG. 8, FIG. 9, FIG. 10 and FIG. 11 are cross-sections of a flat panel display according to other embodiments of the present invention.

As shown in FIG. 1 and FIG. 2, the auxiliary encapsulating member 5 may be formed on an exterior surface of the encapsulating member 4. However, as shown in FIG. 6, the auxiliary encapsulating member 5 may also be formed on an inner surface of the encapsulating member 4.

Figure 7:
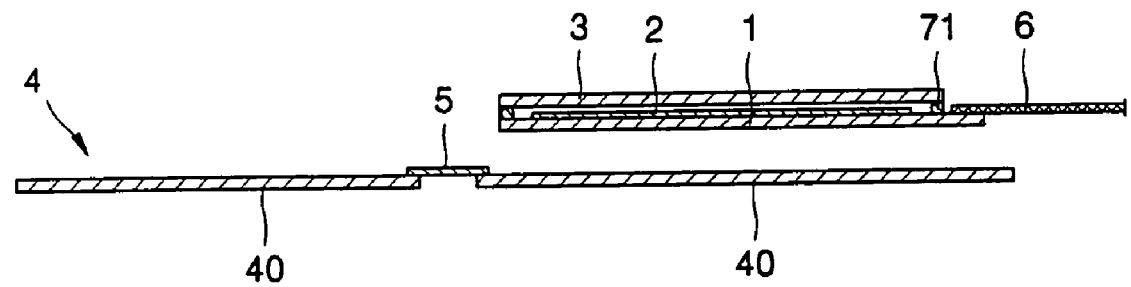

FIG. 7 shows another example of the encapsulating member 4. Referring to FIG. 7, the encapsulating member 4 may include a pair of protection films 40. The two protection films 40 are coupled by the auxiliary encapsulating member 5 to form a single sheet.

Figure 8:
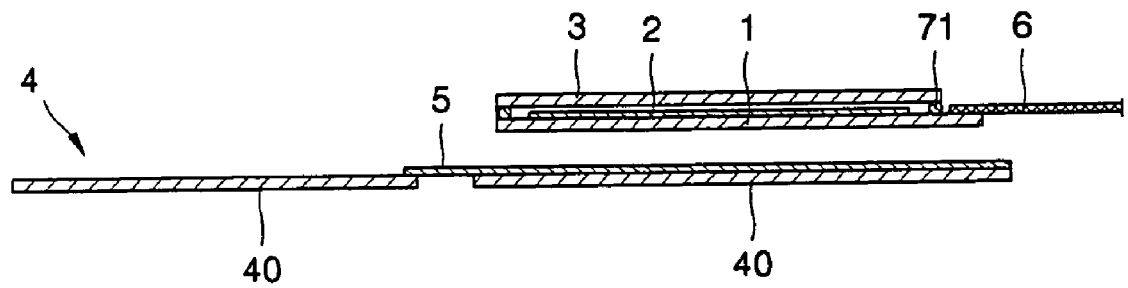

As FIG. 8 shows, the auxiliary encapsulating member 5 may substantially cover the entire area of one of the two protection films 40. In this case, an image is displayed toward the sealing element 3. The structure of the auxiliary encapsulating member 5 that substantially covers the entire area of a protection film 40 is equally applicable to the embodiment of FIG. 1 and FIG. 2 and the embodiment of FIG. 6, namely, when the encapsulating member 4 includes a single protection film 40.

Figure 9:
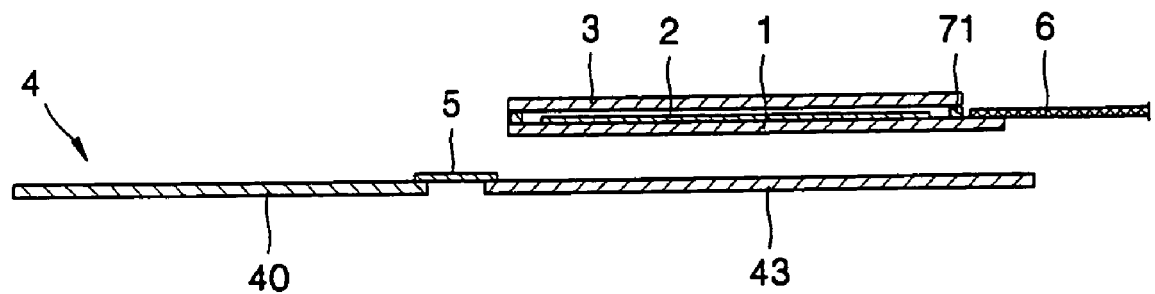

FIG. 9 shows still another example of the encapsulating member 4. Referring to FIG. 9, a protection film 40 and an opposing film 43 are coupled by an auxiliary encapsulating member 5.

The opposing film 43 may be formed of various materials. The opposing film 43 may have the same, or substantially the same, structure as the protection film 40, but the base film 41 may be formed of opaque plastic, glass, or metal. Alternatively, the opposing film 43 may be a glass or metal film having a buffer layer. The opposing film 43 may be flexible, but it may also be formed of a stiff material.

Figure 10:
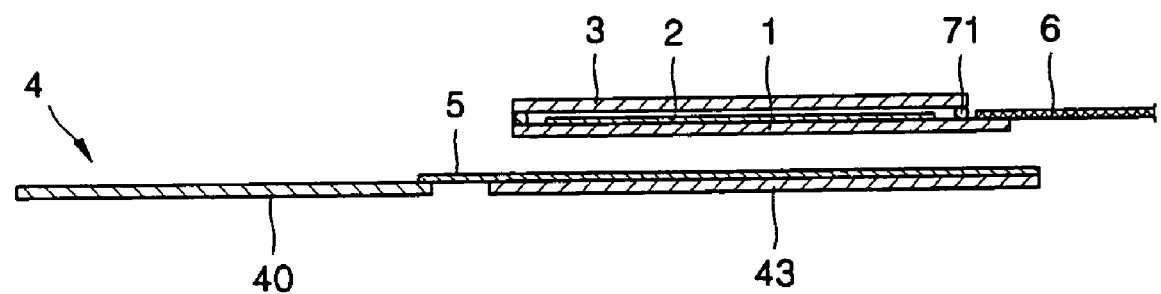

As shown in FIG. 9, the auxiliary encapsulating member 5 may span portions of the films 40 and 43 only where pads (not shown) are formed. Alternatively, as shown in FIG. 10, the auxiliary encapsulating member 5 may substantially cover the entire surface of the opposing film 3.

Figure 11:
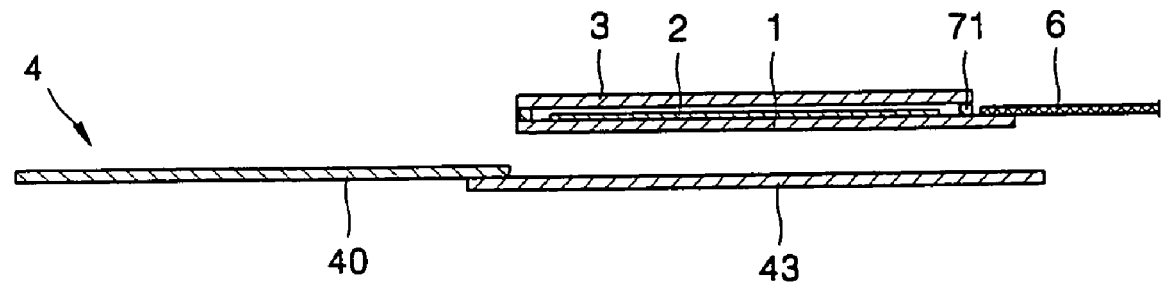

As shown in FIG. 11, the protection film 40 may overlap the opposing film 43. In this case, the opposing film 43 may include a thin film formed of the same material as the material of the auxiliary encapsulating member 5, namely, a metal thin film. For example, the opposing film 43 may be a metal thin film coated with insulative resin.

The structures of the encapsulating member 4 and the auxiliary encapsulating member 5 may be modified into various forms.

The space formed by the bent encapsulating member 4 may be vacuum-sealed or filled with an inert gas. To vacuum-seal the space formed by the bent encapsulating member 4, the encapsulating member 4 may be sealed within a chamber that keeps a predetermined vacuum atmosphere. To fill the space formed by the bent encapsulating member 4 with an inert gas, the encapsulating member 4 may be sealed within a chamber into which the inert gas is injected.

Alternatively, to vacuum-seal the space formed by the bent encapsulating member 4, edges of the encapsulating member 4 may be coated with the second sealant 72, and the encapsulating member 4 is sealed with at least a portion of the edges of the encapsulating member 4 open. Thereafter, air may be exhausted from the space formed by the encapsulating member 4 through the open portion, and then the open portion of the encapsulating member 4 is sealed. In this case, sealing occurs twice, but the vacuum sealing of the space formed by the bent encapsulating member 4 may be smoothly performed. Similarly, to fill the space formed by the bent encapsulating member 4 with an inert gas, the encapsulating member 4 is sealed with at least a portion of the edges of the encapsulating member 4 open, the inert gas is injected into the space formed by the encapsulating member 4 through the open portion, and then the open portion of the encapsulating member 4 is sealed.

Figure 12:
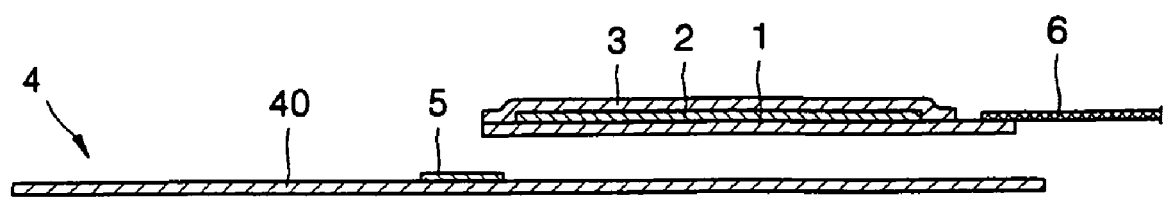
FIG. 12 is a cross-section of a flat panel display according to another embodiment of the present invention.

As FIG. 12 shows, the sealing element 3 may be a sealing film instead of a sealing plate, as in the previous embodiments.

In another embodiment of the present invention, the film-shaped sealing element 3 may include at least one inorganic layer and at least one polymer layer. Similar to the construction of the protection film 40, the film-shaped sealing element 3 may comprise a plastic film on which a protection layer is formed.

More specifically, the inorganic layer of the film-shaped sealing element 3 may be formed of a transparent material that blocks water and air, examples of which include metal oxide, metal nitride, metal carbide, metal oxynitride, and a compound thereof. Examples of the metal oxide include silica, alumina, titania, indium oxide, tin oxide, indium tin oxide, and a combination thereof. Examples of the metal nitride include aluminum nitride, silicon nitride, and a combination thereof. The metal carbide may be a silicon carbide, and the metal oxynitride may be silicon oxynitride. Alternatively, the inorganic layer may be formed of silicon, a ceramic derivative of silicon, or a ceramic derivative of metal. Furthermore, the inorganic layer may be formed of any inorganic material that can block permeation of water and oxygen for example, DLC.

The polymer layer included in the film-shaped sealing element may be formed of an organic polymer, an inorganic polymer, an organometallic polymer, a hybrid organic/inorganic polymer, or other like materials.

The film-shaped sealing element 3 may have various other constructions. It is preferred that the film-shaped sealing element 3 is thinned to obtain an ultra thin organic light emitting device. The film-shaped sealing element 3 may be any thin film that effectively seals the display region of the light emitting device.

Embodiments of the present invention may be applied to organic light emitting displays, as well as to other various flat panel displays including liquid crystal displays, inorganic light emitting displays, electron emission displays, etc.

A flat panel display according to embodiments of the present invention may have the following advantages. An ultra thin, flexible flat panel display may be simply manufactured.

A flexible flat panel display may still have high moisture resistance and high air resistance.

Sealing is enhanced because fewer edges of an encapsulating member have to be sealed.

Even when the encapsulating member is bent, the encapsulation effect is not degraded due to an auxiliary encapsulating member that may be formed at the bent portion of the encapsulating member.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A flat panel display, comprising:
    a light emitting device having a sealed image display area;
    an encapsulating member curved to form an enclosed space, where the light emitting device is arranged in the enclosed space; and
    an auxiliary encapsulating member arranged on at least a bent portion of the encapsulating member but not on a portion of the encapsulating member through which an image is displayed.

2. The flat panel display of claim 1, wherein the encapsulating member is a protection film comprising a single sheet.

3. The flat panel display of claim 2, wherein the auxiliary encapsulating member is arranged on an outer surface of the bent portion of the protection film.

4. The flat panel display of claim 2, wherein the auxiliary encapsulating member is arranged on an inner surface of the bent portion of the protection film.

5. The flat panel display of claim 2, wherein the auxiliary encapsulating member is separately formed and bonded with the protection film.

6. The flat panel display of claim 2, wherein the auxiliary encapsulating member is formed on the protection film by deposition.

7. The flat panel display of claim 1, wherein the encapsulating member includes a pair of protection films that face each other and are bonded with each other.

8. The flat panel display of claim 7, wherein the auxiliary encapsulating member couples the protection films with each other.

9. The flat panel display of claim 1, wherein the encapsulating member includes a protection film and an opposing film that faces the protection film and is bonded with the protection film.

10. The flat panel display of claim 9, wherein the auxiliary encapsulating member couples the protection film and the opposing film with each other.

11. The flat panel display of claim 9, wherein the opposing film comprises the auxiliary encapsulating member.

12. The flat panel display of claim 9, wherein the opposing film is transparent.

13. The flat panel display of claim 9, wherein the opposing film is opaque.

14. The flat panel display of claim 2, wherein the protection film is flexible.

15. The flat panel display of claim 9, wherein the opposing film is flexible.

16. The flat panel display of claim 1, wherein the encapsulating member comprises three edges where sealing occurs.

17. The flat panel display of claim 1, further comprising:
    an adhering unit positioned between the encapsulating member and the light emitting device.

18. The flat panel display of claim 1, further comprising:
    a moisture absorbing unit positioned between the encapsulating member and the light emitting device.

19. The flat panel display of claim 2, wherein the protection film comprises a plastic film comprising an inorganic layer.

20. The flat panel display of claim 19, wherein the inorganic layer is formed of at least one material selected from the group consisting of silicon, metal oxide, metal nitride, metal carbide, metal oxynitride, a ceramic derivative of silicon, a ceramic derivative of metal, diamond-like carbon, and a compound thereof.

21. The flat panel display of claim 19, wherein the plastic film further comprises a polymer layer, the polymer layer being formed of at least one material selected from the group consisting of an organic polymer, an inorganic polymer, an organometallic polymer, and a hybrid organic/inorganic polymer.

22. The flat panel display of claim 1, wherein the auxiliary encapsulating member comprises a metal.

23. The flat panel display of claim 1, wherein the sealing element seals the image display area by being coupled with a substrate of the light emitting device; and wherein the substrate is formed of one of glass, plastic, and metal.

24. The flat panel display of claim 1, wherein the sealing element seals the image display area by being coupled with a substrate of the light emitting device; and wherein the sealing element is a plate.

25. The flat panel display of claim 1, wherein the sealing element seals the image display area by being coupled with a substrate of the light emitting device; and wherein the sealing element is a film.

26. A method of manufacturing a flat panel display, comprising:
    forming a light emitting device by forming an image display area on a substrate and sealing the image display area;
    setting the light emitting device on an encapsulating member;
    arranging an auxiliary encapsulating member on the encapsulating member;
    bending the encapsulating member so that the light emitting device is within a space made by the bent encapsulating member; and sealing edges of the encapsulating member,
wherein the auxiliary encapsulating member is located at a bent portion of the encapsulating member but not on a portion of the encapsulating member through which an image is displayed.

27. The method of claim 26, wherein sealing the edges of the encapsulating member comprises:
coating the edges of the encapsulating member with an adhesive;
sealing the edges of the encapsulating member with at least a portion of the sealed edges open;
exhausting air from the space made by the bent encapsulating member; and
sealing the open portion.

28. The method of claim 26, wherein sealing the edges of the encapsulating member comprises:
coating the edges of the encapsulating member with an adhesive;
sealing the edges of the encapsulating member with at least a portion of the sealed edges open;
inserting an inert gas into the space made by the bent encapsulating member; and
sealing the open portion.

29. The method of claim 26, wherein sealing the edges of the encapsulating member comprises:
coating the edges of the encapsulating member with an adhesive;
forming a vacuum in the space made by the bent encapsulating member; and
sealing the edges of the encapsulating member coated with the adhesive.

30. The method of claim 26, wherein sealing the edges of the encapsulating member comprises:
coating the edges of the encapsulating member with an adhesive;
forming an inert gas ambient in the space made by the bent encapsulating member; and
sealing the edges of the encapsulating member coated with the adhesive.

31. The method of claim 26, further comprising:
forming an adhering unit on a surface of the encapsulating member to set the light emitting device thereon.

32. The method of claim 26, further comprising:
forming a moisture absorbing unit on a surface of the encapsulating member to set the light emitting device thereon.

33. The method of claim 26, wherein the encapsulating member is a protection film comprising a single sheet.

34. The method of claim 26, wherein the encapsulating member includes a pair of protection films that face each other and are bonded with each other.

35. The method of claim 34, wherein the auxiliary encapsulating member couples the protection films with each other.

36. The method of claim 26, wherein the encapsulating member includes a protection film and an opposing film that faces the protection film and is bonded with the protection film.

37. The method of claim 36, wherein the auxiliary encapsulating member couples the protection film and the opposing film with each other.

38. The method of claim 36, wherein the opposing film comprises the auxiliary encapsulating member.

39. The method of claim 33, wherein the protection film comprises a plastic film comprising an inorganic layer.

40. The method of claim 39, wherein the inorganic layer is formed of at least one material selected from the group consisting of silicon, metal oxide, metal nitride, metal carbide, metal oxynitride, a ceramic derivative of silicon, a ceramic derivative of metal, diamond-like carbon, and a compound thereof.

41. The method of claim 39, wherein the plastic film further comprises a polymer layer, the polymer layer being formed of at least one material selected from the group consisting of an organic polymer, an inorganic polymer, an organometallic polymer, and a hybrid organic/inorganic polymer.

42. The method of claim 26, wherein the auxiliary encapsulating member comprises a metal.

* * * * *